Sept. 30, 1969 H. W. GUTSCHE ET AL 3,469,686

RETAINING TRAYS FOR SEMICONDUCTOR WAFERS AND THE LIKE

Filed Feb. 8, 1967 2 Sheets-Sheet 1

INVENTORS
HENRY W. GUTSCHE
DARREL M. HARRIS
ROBERT J. WALSH

BY Robert J. Schaap

ATTORNEY

RETAINING TRAYS FOR SEMICONDUCTOR WAFERS AND THE LIKE

Filed Feb. 8, 1967 2 Sheets-Sheet 2

INVENTORS
HENRY W. GUTSCHE
DARREL M. HARRIS
ROBERT J. WALSH
BY
Robert J. Schaap
ATTORNEY United States Patent Office 3,469,686
Patented Sept. 30, 1969

3,469,686

RETAINING TRAYS FOR SEMICONDUCTOR WAFERS AND THE LIKE

Henry W. Gutsche, St. Louis, Darrel M. Harris, Kirkwood, and Robert J. Walsh, Ballwin, Mo., assignors to Monsanto Company, St. Louis, Mo., a corporation of Delaware Filed Feb. 8, 1967, Ser. No. 614,656
Int. Cl. B65d *85/70, 21/02, 1/34*
U.S. Cl. 206—65 22 Claims

ABSTRACT OF THE DISCLOSURE

A series of marginally registrable plastic trays having a plurality of wells and wherein each well is provided with a tapered wall for supporting a wafer within the well. The wall is tapered so that the bottom thereof is smaller than the wafer and this prevents the polished face of the wafer from contacting any surface of the tray. Each tray is nestable within a like tray so that a series of the trays can be stacked, wrapped and shipped as a unit.

Disclosure

This invention relates in general to certain new and useful improvements in devices for storing and transporting semi-conductor wafers, and more specifically to a plurality of nestable trays which are capable of accommodating a plurality of wafers.

In recent years, semiconductor devices such as silicon controlled rectifiers have found widespread use in the electronics industry. These semiconductor devices are made from semiconductor materials which may have a plurality of layers of semiconductor material having different conductivities and separated by a transition zone. Semiconductor materials of this type having at least two layers of different conductivities with a transition region therebetween are very suitable for use in the formation of electronic members such as diodes, transistors, switches and similar types of electronic structure. One very effective method of producing semiconductor materials is by the epitaxial deposition of silicon on a substrate wafer formed of like material. Generally, the wafers involved must be formed of single crystal silicon with precisely controlled concentrations of doping impurities.

Frequently, the semiconductor wafers have a highly polished surface which must remain free from contact with any foreign surface whatsoever during storage and transporting thereof. It has generally been found that when this polished surface contacts any foreign surface, the surface tends to become contaminated and marred. These slight marrings of the surface and the impurities often materially interfere with effective further processing of the wafers such as growth of epitaxial layers or fabrication of semiconductor devices. In the past, transporting of the wafer between steps in processing thereof has often caused serious problems since it was not always possible to maintain the wafers in a substantially clean atmospheric environment. Furthermore, accidental contact with the surface of the wafer often occurred through inadvertence which, in effect, made subsequent processing steps futile and destroyed the value of the semiconductor wafer.

These problems were even more severe during shipping of the wafers to the purchasers thereof. Generally, each of the wafers had to be enclosed in a specially designed bag of plastic or paper which was treated in order to eliminate impurities. Even in this type of container, it was impossible to prevent contact of the wafer surface with the bag, per se. It was necessary to wrap these wafers and stack them in such manner that a minimum of movement could be obtained. However, due to this technique, the surface of a number of the wafers was often contaminated by the time they were received by the user thereof. Accordingly, the various methods heretofore employed for the handling, shipment and storage of semiconductor wafers have not been very effective.

It is, therefore, the primary object of the present invention to provide a series of marginally registrable nestable trays which are capable of carrying semiconductor wafers in such manner that the critical surfaces of the semiconductor wafers do not contact any foreign surface.

It is another object of the present invention to provide a series of retaining trays of the type stated which can be manufactured in a mass-production operation and are capable of being constructed with desired tolerance so that adverse surface conditions are not created on the semiconductor wafers carried therein.

It is also an object of the present invention to provide a retaining tray of the type stated for a plurality of wafer diameters.

It is a further object of the present invention to provide retaining trays of the type stated which are specifically designed so that inadvertent handling of the wafers will not cause injury thereof in the retaining trays.

It is an additional object of the present invention to provide retaining trays of the type stated which are disposable and which can be manufactured at a relatively low unit cost.

Figure 6:
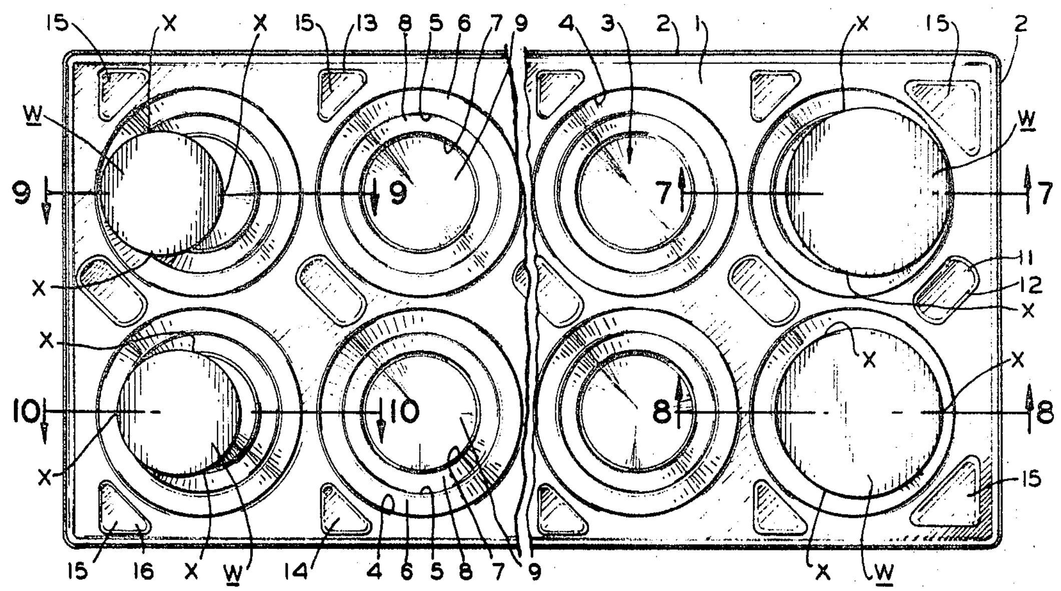

FIGURE 6 is a top plan view, partially broken away, of a wafer support tray and showing four wafers which are annularly misplaced in retaining wells; and FIGURES 7, 8, 9 and 10 are fragmentary vertical sectional views taken along lines 7—7, 8—8, 9—9 and 10—10 respectively.

The present invention relates to a series of nestable retaining trays which are designed to carry semiconductor wafers having a polished or epitaxial surface. A series of retaining trays, which are capable of being stacked in marginal registration are provided. Each of the retaining trays is preferably made of a somewhat rigid but yet sufficiently flexible plastic material and each include a plurality of retaining wells. The retaining wells include a series of diametrally smaller vertically spaced shoulders and a pair of tapered wall sections which are designed in such manner that a wafer disposed within the well with the critical surface presented in a generally downward position does not contact any surface of the well. In essence, the tapered wall sections are so designed that only the peripheral margins of the wafer come in contact with any portion of the well. When the wafer is disposed in a substantially horizontal position, the peripheral margins of the entire surface of the wafer will frictionally engage the tapered wall section at the proper diametral cross section.

A wafer is placed in each retaining well of each retaining tray and a similar retaining tray is vertically disposed thereon in marginal registration. Each of the retaining trays includes a plurality of downwardly extending bosses or protuberances which extend into the apertures of similar protuberances on a lower tray. In this manner, it is possible to marginally align each of the trays during the vertical stacking operation. Furthermore, each of the trays includes a peripheral upstanding flange, which is capable of engaging the peripheral margin of the next tray stacked thereon. The flanges are sized so that they engage the next adjacent upper tray in a snap fitting manner. Furthermore, when one tray is vertically disposed on the other tray, the bottom portion of the well of the upper tray engages the upwardly presented surface of the wafer in the lower tray thereby holding the same in a relatively immobile position, but nevertheless in a position where the downwardly presented critical surface does not contact any portion of the well of the retaining tray.

Referring now in more detail and by reference characters to the drawings which illustrate a preferred embodiment of the present invention, A designates a retaining tray which is preferably formed of a somewhat rigid, but slightly flexible plastic material, such as polystyrene, polyethylene, Teflon or the like. Furthermore, the tray can be made in a solid permanent form from more rigid materials such as methyl methacrylate, a more rigid polystyrene or polystyrene-polybutadiene copolymer or the like.

Figure 1:
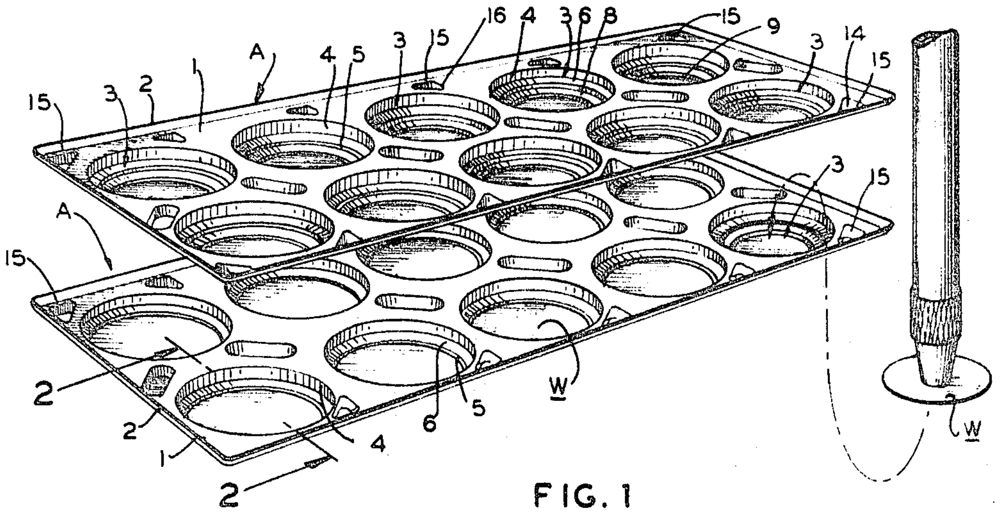
FIGURE 1 is a perspective view of a pair of retaining trays which are constructed in accordance with and embody the present invention and show a plurality of wafers disposed therein.

The retaining tray A generally comprises a relatively flat sheet or so-called "support plate" 1, which is integrally formed with an upstanding peripheral flange 2. The supporting sheet 1 is integrally formed with two rows of wafer retaining wells 3, with five retaining wells in each row, in the manner as illustrated in FIGURE 1. It should be recognized, however, that the sheet 1 could be preformed with any desired number of retaining wells and the invention is not limited to the number of retaining wells illustrated or to the specific pattern in which they are formed in the retaining sheet 1.

Figures 2, 3:
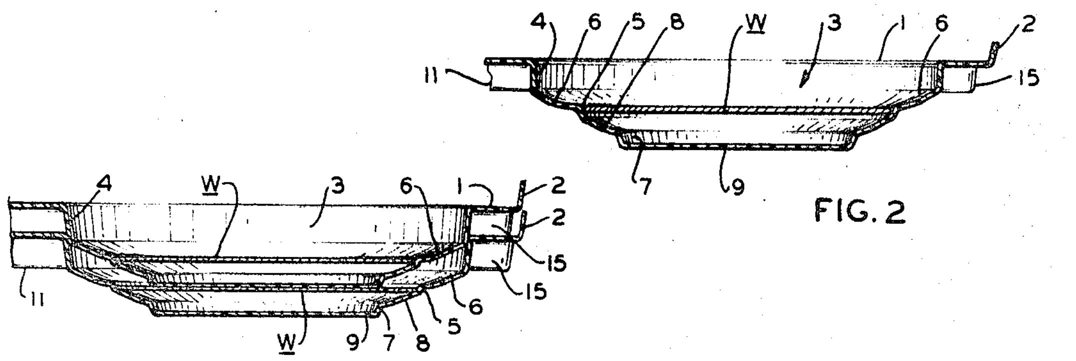
FIGURE 2 is a fragmentary vertical sectional view taken along line 2—2 of FIGURE 1.
FIGURE 3 is a vertical sectional view similar to the sectional view of FIGURE 2 and showing portions of the retaining wells of a pair of stacked trays with wafers disposed therein.
Figure 7:
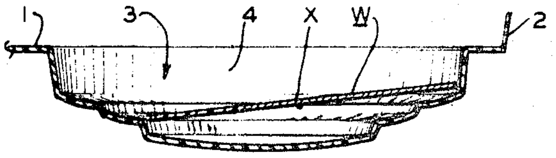
Figure 9:
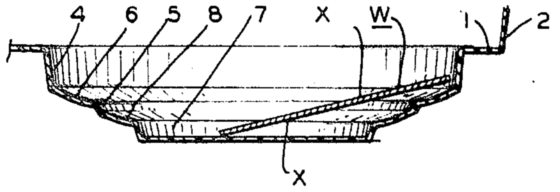
Figure 8:
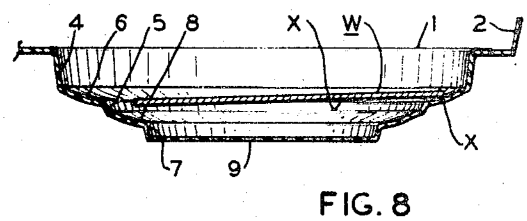
Figure 10:
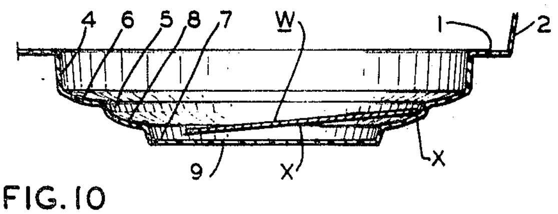

Each of the retaining wells 3 generally comprises a circular, vertically disposed rim-forming wall 4, which integrally merges into the flat sheet in the manner as illustrated in FIGURE 2. The rim forming wall 4, in turn, is connected to a downwardly and inwardly inclined upper tapered wall 5 through a relatively flat inclined annular shoulder 6. The upper wall 5 is connected to a lower downwardly and inwardly extending tapered wall 7 through a relatively flat inclined annular shoulder 8 in the manner as illustrated in FIGURE 2. It can be seen that the lower tapered wall 7 is diametrally smaller than the tapered wall 5 and extends downwardly and inwardly at approximately the same slope as the tapered wall 5. The lower tapered wall 7, in turn, merges at its lower margin into a slightly convex bottom wall 9 as illustrated in FIGURE 7.

Figure 4:
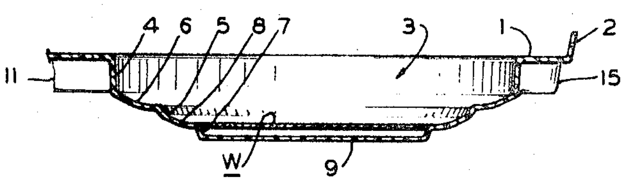
FIGURE 4 is a fragmentary vertical sectional view, similar to the sectional view of FIGURE 2 and showing a diametrally smaller wafer disposed therein.
Figure 5:
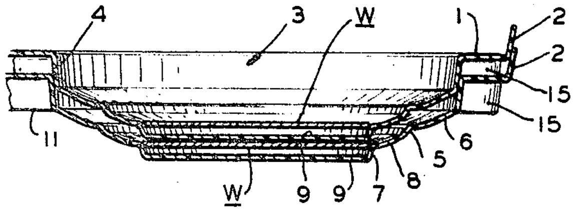
FIGURE 5 is a fragmentary vertical sectional view similar to the sectional view of FIGURE 3 and showing the retaining wells of a pair of stacked trays with the diametrally smaller wafers disposed therein.

The bottom wall 9 is slightly diametrally smaller than a semiconductor wafer W, which is to be disposed within the retaining well 3. Accordingly, it can be seen that a wafer W which is disposed therein in a position substantially parallel to the bottom wall 9 is supported on either one of the tapered walls 5, 7 depending on the size of the wafer W. The tapered wall 5 is designed to generally accept 1¼ inch diameter wafers and the tapered wall 7 is designed generally to accept 1 inch wafers as illustrated in FIGURES 2 and 4. Accordingly, it can be seen that at least two diameter sizes of wafers W can be conveniently supported and disposed within each of the retaining wells 3.

Generally, the retaining tray A of the present invention was designed for use with polished silicon semiconductor wafers. However, the invention is by no means limited to these types of wafers and the various applications thereof are set forth in more detail hereinafter. For purposes of illustration and description of the present invention, it may be assumed that the wafers are, for example, silicon wafers with an epitaxial silicon coatinng formed thereon. This epitaxial silicon surface is the critical surface which must be maintained in a dust-free atmosphere. The preparation of the epitaxial silicon surface involves a great deal of time-consuming preparations and is very costly. It has been found that even slight contact with this surface is often sufficient to abrade the surface to an extent where it is no longer usable for the manufacture of semiconductor devices. In addition, it has also been found that mere momentary touching of the wafer by a fingertip will also create sufficient contamination on the surface thereof that it may be rendered unusable. The same problems hold true for semiconductor wafers with highly polished surfaces. These treated surfaces, which must be protected, are herein referred to as the "critical surfaces." The retaining tray A of the present invention was designed to specifically overcome these problems.

By reference to FIGURES 6–10, it can be seen that each of the retaining wells 3 is so constructed that a wafer W disposed therein can be oriented in substantially any position and the substantial position of the epitaxial surface thereof will still remain out of contact with any portion of the walls in the well 3. In essence, if the tray A should be inadvertently tipped so that the wafer W is no longer supported on the tapered walls 5 or 7, it may shift to a position substantially as illustrated in any of FIGURES 7 through 10. For example, in FIGURE 9, it can be seen that a portion of the annular margin of a wafer W is supported on the bottom wall 9. The peripheral margin of the wafer W is actually supported in the manner as illustrated in FIGURE 6 and on the spaced points (labeled X). It can be seen that the epitaxial surface of the wafer W will remain out of contact with any portion of the walls of the well 3 and only the peripheral margin of the wafer will contact any portion of the walls of the well 3 at any one time.

In order to maintain brevity, only one of the retaining wells 3 has been described herein and only one has been illustrated in detail in the accompanying drawings. However, it should be recognized that each of the other retaining wells are substantially identical in construction and are, therefore, neither illustrated nor described in detail herein.

Each retaining tray A is provided with 6 longitudinally spaced downwardly extending projections 11 which are rather oblong and generally rectangular in shape, with arcuate ends thereon, substantially as illustrated in FIGURES 1 and 6. Furthermore, a recess 12 is formed in each of the projections. The downwardly extending projection 11 of one tray is designed to extend into the recesses 12 of a tray disposed immediately therebeneath, when each of the trays are stacked. In essence, the projections 11 are designed to provide a convenient method of maintaining marginal registration of a series of stacked trays. It can be seen that five of the downwardly extending projections 11 are all oriented in the same direction, and generally diagonally located with respect to the corners of the tray A. However, one of the projections 11 is angularly located with respect to each of the other five projections and that its flat surfaces are generally located at right angles to the flat surfaces of each of the other five projections in the manner as illustrated in FIGURE 6.

Each of the trays A is also provided with two rows 13, 14 of triangularly shaped downwardly projecting lugs 15. Each row is located along a longitudinal margin of the tray A in the manner as illustrated in FIGURE 1 and furthermore, each row contains a total of 6 lugs 15. Five of the lugs 15 in the row 13 are generally oriented in the same direction and have their oblique faces generally pointed toward one transverse end of the tray in the manner as illustrated in FIGURE 6. Additionally, five opposed lugs 15 in the oppositely presented row 14 have their oblique faces generally pointed toward the same transverse end of the tray A. The six lugs 15 in each of the rows 13, 14 are oriented in a direction which is angularly located with respect to each of the other lugs in their respective rows. In fact, the oblique face of the last-named lugs in row 13 is parallel to the oblique faces of each of the five lugs in the row 14. In like manner, the one lug in the row 14 has its oblique face parallel to the remaining five lugs in the row 13. Each of these lugs 15 serves to provide marginal registration of a series of vertically stacked trays. In addition, the lugs also serve as spacer elements so that two trays cannot be stacked too tightly and, thereby, cause injury to any of the wafers W disposed in any of the wells 3. It should be understood that the peripheral flange 2 is sufficiently large so that the trays can be stacked and nested in one another without creating undue pressure on each of the wafers W disposed in the retaining wells 3.

By further reference to FIGURE 1, it can be seen that the trays are so designed that they are capable of stacking within each other in marginal registration. However, it is to be noted that the trays must be properly oriented with respect to each other. In other words, the projections 11 and the lugs 15 of the tray A must all be aligned and oriented in the same direction as the respective projections 11 and lugs 15 in the next adjacent tray. This type of system must further compensate for non-linearities in the manufacturing of each of the trays A. By reference to FIGURE 1, it can be seen that each of the downwardly extending lugs 13 are actually integrally formed with the tray A, and thereby create recesses 16 in each of the lugs. In this manner, a lug 15 of an upwardly disposed tray can extend into the recess 16 of the tray disposed immediately therebeneath.

This method of transporting each of the wafers W has been found to be highly successful and has substantially eliminated the problems of contacting the surface of the wafer W with any foreign matter, thereby maintaining a high degree of purity and eliminating any surface abrasion. While the trays of the present invention were specifically designed for use with polished silicon wafers and silicon wafers having epitaxial silicon or oxide coatings thereon, they are also successfully employed with other types of semiconductor wafers, such as gallium arsenide wafers and gallium arsenide phosphide wafers. Furthermore, the trays are equally suitable to hold and transport and store similar slice-shaped objects which have critical surfaces prepared by methods other than machine polishing, objects with critical surfaces which have been prepared by cleaning, chemically etching, vapor etching, deposition from the vapor phase, sputtering, or other thin film techniques, crystallization from the melt, chemical or electrolytical precipitation from solution can also be successfully used in the retaining trays of the present invention. Furthermore, the tray is capable of handling slices of any regular shape, preferably in the form of a flat disc and may consist of materials other than semiconductor materials, such as solid metal and metal alloys and minerals. The wafers which may be used in the trays of the present invention may be formed of glass, quartz, ceramics, sapphire and other precious and semi-precious stones.

When transporting a series of marginally registered stacked trays, the trays may be stored in a hermetically sealable container or simply wrapped in a substantially self-sealing dust-proof foil or plastic film. The trays may then be properly stacked and placed in a suitable shipping container as desired. It should be observed that the wafers W would not be damaged even if the trays A were inadvertently turned over. It can be observed that after the wafers W have been properly inserted into each of the wells 3, they are more or less frictionally held by the tapered walls 5, 7. In addition, the bottom wall 9 of the tray disposed immediately thereabove will hold the wafers in a substantially rigid position in the retaining well 3. This type of condition eliminates any possibility of contamination or abrasion to the critical surface of the wafer.

It should be understood that changes and modifications in the form, construction, arrangement and combination of parts presently described and pointed out may be made and substituted for those herein shown without departing from the nature and principle of our invention.

Having thus described our invention, what we desire to claim and secure by Letters Patents is:

1. A device for retaining thin flat semiconductor wafers and the like which have a pair of opposed flat planar surfaces, one of which constitutes a critical surface, said device comprising a supporting member, at least one recess operatively associated with said supporting member and being sized to accommodate semiconductor wafers and the like, said recess having a bottom wall which is slightly diametrally smaller than a wafer disposed in said recess, and a tapered wall formed in said recess and merging into said bottom wall for supporting said wafer in spaced relation with respect to said bottom wall, said tapered wall having an angle of taper and size established so that a substantial portion of the critical surface of said wafer does not contact any portion of the recess when located in substantially any position with respect to said bottom wall.

2. The device of claim 1 further characterized in that a plurality of recesses are operatively associated with said supporting member.

3. The device of claim 1 further characterized in that a peripheral upstanding flange extends along the peripheral margin of said supporting member and being sized to engage the peripheral margins of like supporting members.

4. The device of claim 1 further characterized in that a plurality of downwardly extending elements are formed on said supporting member, a recessed portion is formed in each of said downwardly extending element and is sized to retain a like element of another device.

5. The device of claim 4 further characterized in that said supporting sheets are provided with a plurality of rows of said downwardly extending elements and recessed portions.

6. The device of claim 5 further characterized in that said elements and recessed portions are somewhat triangularly shaped, and that at least one of the elements in each of the rows is oriented in a direction which is different than the orientation of each of the other elements in the row.

7. A device for retaining semiconductor wafers and the like, said device comprising a supporting member, at least one recess operatively associated with said supporting member and being sized to accommodate semiconductor wafers and the like, said recess having a vertical annular wall integrally formed with said supporting member, a first inwardly inclined intermediate wall, a first shoulder element connecting said vertical annular wall and said first intermediate wall, a second inwardly inclined intermediate wall, a second shoulder element connecting said first and second intermediate walls, and a bottom wall formed with said second intermediate wall, said first and second intermediate walls being inclined at an angle sufficient to support said wafer in an angular position with respect to said bottom wall so that a substantial portion of one flat surface of said wafer does not contact any portion of the recess.

8. The device of claim 7 further characterized in that said first and second inclined intermediate walls extend in planes which are substantially parallel to each other.

9. The device of claim 7 further characterized in that said first and second shoulder elements curve outwardly of said recess.

10. A device for retaining thin flat semiconductor wafers and the like which have a pair of opposed flat planar surfaces, one of which constitutes a critical surface, said device comprising a supporting member, at least one recess operatively associated with said supporting member and being sized to accommodate semiconductor wafers and the like, said recess having a vertical annular wall formed with said supporting member, an inwardly inclined intermediate wall, a shoulder element connecting said vertical wall and intermediate wall, and a bottom wall formed with said intermediate wall and being slightly diametrally smaller than a wafer disposed in said recess, said intermediate wall being inclined at an angle sufficient to support said wafer in spaced relation with respect to said bottom wall so that a substantial portion of the critical surface of said wafer does not contact any portion of the recess.

11. The device of claim 10 further characterized in that a plurality of recesses are operatively associated with said supporting member.

12. A system for retaining and transporting thin flat semiconductor wafers and the like, which have a pair of opposed flat planar surfaces, one of which constitutes a critical surface, said system comprising a plurality of nestable holding devices, each holding device having a supporting member and at least one downwardly extending somewhat circular projection, said projection being substantially hollow in the form of a recess for accommodating semiconductor wafers and the like, said recess having a bottom wall and a tapered side wall which merges into said bottom wall for supporting the wafer in spaced relation to said bottom wall so that a substantial portion of the critical surface of the wafer does not contact said recess, the projection of one device being sized to extend within the recess of another device permitting a stacking arrangement of like devices, the bottom wall of a projection of one holding device being engageable with a wafer disposed in a recess of another holding device when the projection thereof extends into the recess containing said wafer, the projection on each said device being located in such position on each device that each of said devices are marginally registered in a stacked arrangement.

13. The system of claim 12 further characterized in that each supporting member has a plurality of projections and recesses formed therein.

14. The system of claim 12 further characterized in that a peripheral upstanding flange surrounds the peripheral margins of each supporting member and engages the exterior surface of a flange on a device disposed immediately thereabove.

15. The system of claim 12 further characterized in that a plurality of downwardly extending elements are operatively associated with each device and are sized and located to extend into registered recesses formed in a device disposed immediately therebeneath.

16. The system of claim 12 further characterized in that the bottom wall is curved outwardly and is engageable with the flat surface opposite the critical surface of a wafer in a recess of another device when a pair of devices are attached.

17. A device for retaining thin flat semiconductor wafers and the like which have a pair of opposed flat planar surfaces, one of which constitutes a critical surface, said device comprising a supporting member, at least one recess operatively associated with said supporting member and being sized to accommodate semiconductor wafers and the like, said recess having a bottom wall which is slightly diametrically smaller than a wafer disposed in said recess, and a tapered wall formed in said recess and merging into said bottom wall for supporting said wafer in spaced relation with respect to said bottom wall, said tapered wall having an angle of taper and size established so that a substantially air tight pocked exists between the critical surface of said wafer and said bottom wall.

18. A system for retaining and transporting thin flat semiconductor wafers and the like which have a pair of opposed flat planar surfaces, one of which constitutes a critical surface, said system comprising a plurality of nestable holding devices, each holding device having a supporting member and at least one downwardly extending somewhat circular projection, said projection being substantially hollow in the form of a recess for accommodating semiconductor wafers and the like, said recess having a bottom wall and a tapered side wall which merges into said bottom wall for supporting the wafer in spaced relation to said bottom wall so that a substantially air tight pocket exists between the critical surface of the wafer and the bottom wall of the recess in which said wafer is disposed, the projection of one device being sized to extend within the recess of another device permitting a stacking arrangement of like devices, the bottom wall of a projection of one holding device being engageable with a wafer disposed in a recess of another holding device when the projection thereof extends into the recess containing said wafer, the projection on each said device being located in such position on each device that each of said devices are marginally registered in a stacked arrangement.

19. The combination of a retaining device and a thin flat semiconductor wafer wherein said wafer is provided with a pair of opposed flat planar surfaces, one of which constitutes a critical surface, said device comprising a supporting member, at least one recess operatively associated with said supporting member and having a semiconductor wafer disposed therein, said recess having a bottom wall which is slightly diametrically smaller than said wafer disposed therein, and a tapered wall formed in said recess and merging into said bottom wall for supporting said wafer in spaced relation with respect to said bottom wall so that a substantial portion of the critical surface of said wafer does not contact any portion of the recess when located in substantially any position with respect to said bottom wall.

20. A device for retaining thin flat semiconductor wafers and the like which have a pair of opposed flat planar surfaces, one of which constitutes a critical surface, said device comprising a supporting member, at least one recess operatively associated with said supporting member and being sized to accommodate semiconductor wafers and the like, said recess having a bottom wall which is slightly diametrally smaller than a wafer disposed in said recess, and a plurality of diametrally reduced tapered wall sections formed in said recess one of said tapered wall sections merging into said bottom wall, said tapered wall sections being sized to support said wafer in spaced relation with respect to said bottom wall so that a substantial portion of the critical surface of said wafer does not contact any portion of the recess when located in substantially any position with respect to said bottom wall.

21. A device for retaining thin flat semiconductor wafers and the like which have a pair of opposed flat planar surfaces, one of which constitutes a critical surface, said device comprising a supporting member, at least one recess operatively associated with said supporting member and being sized to accommodate semiconductor wafers and the like, said recess having a bottom wall which is slightly diametrally smaller than a wafer disposed in said recess, and a tapered wall formed in said recess and merging into said bottom wall for supporting said wafer in spaced relation with respect to said bottom wall so that a substantial portion of the critical surface of said wafer does not contact any portion of the recess when located in substantially any position with respect to said bottom wall, said recess including a pair of spaced diametrally reduced annular shoulders.

22. A device for retaining thin flat semiconductor wafers and the like which have a pair of opposed flat planar surfaces, one of which constitutes a critical surface, said device comprising a supporting member, at least one recess operatively associated with said supporting member and being sized to accommodate semiconductor wafers and the like, said recess having a slightly convex bottom wall which is slightly diametrally smaller than a wafer disposed in said recess, and a tapered wall formed in said recess and merging into said bottom wall for supporting said wafer in spaced relation with respect to said bottom wall, said tapered wall having an angle of taper and size established so that a substantial portion of the critical surface of said wafer does not contact any portion of the recess when located in substantially any position with respect to said botom wall.

References Cited

UNITED STATES PATENTS

| | | | |
|---|---|---|---|
| 2,776,772 | 1/1957 | Tamotsu | 206—65 X |
| 3,080,964 | 3/1963 | Robinson et al. | |
| 3,311,229 | 3/1967 | Troll et al. | 206—56 |

FOREIGN PATENTS

| | | |
|---|---|---|
| 1,335,120 | 7/1963 | France. |
| 106,173 | 5/1917 | Great Britain. |
| 955,883 | 4/1964 | Great Britain. |

OTHER REFERENCES

German printed application, Pat. No. 1,129,884, May 1962, Kiehn.

MARTHA L. RICE, Primary Examiner

U.S. Cl. X.R.

206—72; 217—26.5; 220—23.6